United States Patent [19]  
Mine et al.

[11] Patent Number: 5,008,733  
[45] Date of Patent: Apr. 16, 1991

[54] SEMICONDUCTOR DEVICE

[75] Inventors: Katsutoshi Mine; Yoshitsugu Morita; Satoshi Miyamae, all of Ichihara, Japan

[73] Assignee: Toray Silicone Company, Limited, Tokyo, Japan

[21] Appl. No.: 161,164

[22] Filed: Feb. 26, 1988

Related U.S. Application Data

[63] Continuation of Ser. No. 629,823, filed as PCT JP83/00405 on Oct. 11, 1983.

[30] Foreign Application Priority Data

Oct. 11, 1982 [JP] Japan ................... 57-196928

[51] Int. Cl.$^5$ .................. H01L 23/28; H01L 23/30
[52] U.S. Cl. ............................. 357/72; 357/84
[58] Field of Search .............. 357/72, 80, 74, 84

[56] References Cited

U.S. PATENT DOCUMENTS 3,939,488 2/1976 Wakashima et al. ............... 357/72
4,331,970 5/1982 German ........................... 357/72
4,626,556 12/1986 Nozue et al. ..................... 357/72

FOREIGN PATENT DOCUMENTS 3222791 12/1983 Fed. Rep. of Germany ........ 357/72
55-140249 11/1980 Japan ............................. 357/72
0047745 3/1984 Japan ............................. 357/72
2036428 6/1980 United Kingdom ............... 357/80

Primary Examiner—Rolf Hille  
Assistant Examiner—S. V. Clark  
Attorney, Agent, or Firm—Scully, Scott, Murphy & Presser

[57] ABSTRACT

A semiconductor device (1) in which a heat-bondable cured silicone (7) is applied and heat-bonded to the surface of only a predetermined principal portion of the semiconductor device so as not to contact bonding wires (3), flip chip solder portions (8) or beam leads, in order to protect the surface of the principal portion, and a seal layer (6) or (10) is provided after the heat bonding of the cured silicone. The cured silicone (7) is preferably in the form of a film, and a heat-resistant base material (12) may be laminated to one side of the cured silicone. Breaking of bonding wires (3), cracking of solder portions (8) and separation of beam leads do not occur because only the portion to be protected can be protected by coating with the cured silicone (7) and the portion not to be protected is not so coated. Moreover, sisnce there is no contamination caused by a silicone exhalation, the occurrence of a defective bonding and the separation of a sealing resin can be prevented. The seal layers (6) and (10) are each constituted by a hermetic seal or a resin seal.

15 Claims, 3 Drawing Sheets

SEMICONDUCTOR DEVICE

This is a continuation of copending application Ser. No. 629,823, filed as PCT TP83/00405 on Oct. 11, 1983.

FIELD OF ART

The present invention relates to a semiconductor device and more particularly to a semiconductor device with a heat-bondable cured silicone applied and heat-bonded to at least a surface thereof.

BACKGROUND ART

In semiconductor devices, usually a high purity coating material is applied for preventing the surface of a semiconductor chip particularly PN junction and bonding pad portion, as well as fine aluminum or gold wires from undergoing deterioration of characteristics or corrosion caused by moisture or impurities and also for shielding a thermal and mechanical stress relaxation memory element from α-ray. And a sealing by molding with a synthetic resin or a hermetic seal using a metallic or ceramic vessel is applied for fixing and enclosing the surface-coated semiconductor chip, bonding wires and lead wires for external connection.

Materials used for protecting the surface of a semiconductor chip are generally called junction coating resins or undercoating materials. As these materials there are used specially purified silicone resins and polyimide resins.

Junction coating resins are classified into a solution type with resin dissolved in a solvent and a solventless type not containing a solvent, and generally assume a liquid state.

As packaging forms, there are a one-pack type and a two-pack type. As resin curing mechanisms, there are a condensation type which involves the formation of a by-product and an addition type which does not produce a by-product. As curing methods, there are a room temperature curing method, a heat curing method and a radiation curing method. As cured resin forms, there are gel-like form which is superior in stress relaxing effect and adhesion, a rubbery form which is superior in stress relaxing effect, and a hard resin form which is superior in mechanical strength and dielectric strength.

Thus, there are a great variety of junction coating resins, but in their semiconductor use, the most suitable resin is selected according to the semiconductor's surface state, design withstand-voltage, shape and packaging method. The selected junction coating resin is applied onto the surface of a semiconductor chip so as to afford desired area and coating thickness usually by the use of a dispenser. Thereafter, the junction coating resin is cured by a method suitable for the resin, for example, by curing in a high temperature and high humidity atmosphere, by curing in a high temperature atmosphere, or by irradiation of an ultraviolet ray having a suitable wave length.

After application and curing of the junction coating resin, there generally is performed a sealing with a molding resin such as, for example, a silicone resin or an epoxy resin, or a hermetic seal using a metallic or ceramic vessel for the purpose of fixing and enclosing the semiconductor chip, bonding wires and lead wires for external connection.

However, in semiconductor devices using such conventional liquid junction coating resins as described above, there are involved various problems, for example:

①It is difficult to coat only a predetermined portion exactly with a junction coating resin; in other words, even a portion not to be coated is often coated with the resin. Further, since the other portion is contaminated by a component by-produced during heat curing of the junction coating resin, an attempt to connect bonding wire or perform soldering results in a defective connection or a poor adhesion of a sealing resin.

②If a wire bonding type resin-sealed IC obtained by coating the surface of a semiconductor chip and 25μ-dia. gold bonding wires with a liquid addition reaction type junction coating silicone resin, then curing the resin into a rubbery state by heating and thereafter sealing the circumference by molding with an epoxy resin, is subjected to a heat shock test in which the IC is held at −50° C. for 30 minutes and immediately thereafter is held at 150° C. for 30 minutes, there occurs breaking of the bonding wires from around 20 cycles which is presumed ascribable to expansion and contraction of the junction coating silicone resin in contact with the bonding wires.

③If a wire bonding type resin-sealed transistor obtained by coating the surface of a semiconductor chip and 30μ-dia. aluminum bonding wires with a liquid addition type junction coating silicone resin, then curing the resin into a rubbery state by heating and subsequently sealing the circumference by molding with a silicone resin, is subjected, after application thereto of a silicone compound for heat dissipation, to a heat fatigue test in which turning on and off of power is repeated, there occurs breaking of the bonding wires from 2,000 cycles which is presumed ascribable to swelling of the junction coating resin in contact with the bonding wires caused by the silicone oil which has permeated the resin.

④As to a hybrid IC, if a condensation type junction coating silicone resin of a high viscosity is applied to a very small portion on a substrate and cured into a rubbery state by allowing it to stand at room temperature for 24 hours and then gold wires are connected to bonding pad portion adjacent to the applied portion, there frequently occurs a defective connection of the bonding wires which is presumed ascribable to the diffusion of the liquid silicone resin to the pad portion.

It is an object of the present invention to prevent the occurrence of the above-mentioned problems.

It is another object of the present invention to provide a semiconductor device having a high reliability.

It is a further object of the present invention to provide a semiconductor device free from breaking of bonding wires, cracking of solder and peeling of beam leads.

It is still a further object of the present invention to provide a semiconductor device not causing a defective bonding and superior in adhesion of a sealing resin.

DISCLOSURE OF THE INVENTION

The present invention relates to a semiconductor device with a heat-bondable cured silicone applied and heat-bonded to the surface of at least a principal portion of the device.

The "semiconductor device" referred to herein includes not only discrete semiconductors such as transistor and thyristor but also semiconductor devices in a broad sense, including IC's such as hybrid IC and monolithic IC. Further, not only wire bonding type semiconductor devices but also flip type semiconductor devices and beam lead type semiconductor devices are included.

The "heat-bondable cured silicone" referred to herein represents a cured silicone which bonds to an object upon heating with its surface in contact with the object. Examples are ①a cured silicone having silicon atom-bonded hydrogen atoms in a cured state, ②a cured silicone having silicon atom-bonded hydrolyzable groups in a cured state and ③a cured silicone having both silicon atom-bonded hydrogen atoms and silicon atom-bonded hydrolyzable groups in a cured state.

As the cured silicone ①there is mentioned, for example, a cured product of a composition which contains as main components a vinyl group-containing organopolysiloxane, organohydrogen polysiloxane and a platinum compound catalyst and in which silicon atom-bonded hydrogen atoms are present in a large excess relative to silicon atom-bonded vinyl groups.

As the cured silicone ②there is mentioned, for example, a cured product of a composition containing as main components a vinyl group-containing organopolysiloxane, an organohydrogen polysiloxane, an allyltrialkoxysilane and a platinum compound catalyst.

As the cured silicone ③there is mentioned, for example, a cured product of a composition which contains as main components a vinyl group-containing organopolysiloxane, an organohydrogen polysiloxane, an allyltrialkoxysilane and a platinum compound catalyst and in which silicon atom-bonded hydrogen atoms are present in a large excess relative to silicon atom-bonded vinyl groups.

The heat-bondable cured silicone may be in a state ranging from a rubbery elastomer having a hardness of 0 measured by a JIS rubber hearness tester up to a resinous state having a high hardness. If necessary, it may contain an addition reaction retarder, an inorganic filler, an organic filler, a heat resisting agent, a pigment, etc. But, it is desirable that particularly the content of alkali metal and that of halogen ions as impurities which badly affect the characteristics of semiconductor be each not more than 5 ppm. Further, when the heat-bondable cured silicone is used as a material for shielding a semiconductor memory element from α-ray with a view to preventing malfunction caused by α-ray which has recently become a subject of discussion, it is desirable that the total content of radioactive elements such as uranium (U) and thorium (Th) in the heat-bondable cured silicone be not more than 1 ppb.

The heat-bondable cured silicone is preferably in the form of a film or a sheet, whose thickness is suitably selected according to the purpose of use of the cured silicone and the kind of semiconductor, but preferably not larger than 1 mm, and preferably not smaller than 30μ from the standpoint of handling operation. The heat-bondable cured silicone may be used alone, or in combination with a heat-resistant base material of a high purity not badly affecting the characteristics of semiconductor, e.g. a film such as a polyimide, polyamide or polyimide-amide film or a glass cloth, which is laminated to one side of the cured silicone. By lamination with such heat-resistant base material, the strength and mounting workability are improved. Further, the adhesion to a sealing resin is improved and the resistance to moisture of the semiconductor element is remarkably improved. The thickness of the heat-resistant base material is not specially limited, but preferably in the range of 1 to 100μ.

The semiconductor device of the present invention is produced by coating the surface of at least a principal portion of the device with the heat-bondable cured silicone, followed by heating, for example, at 70° C. or higher for 30 minutes or longer, thereby allowing the silicone to be strongly bonded to the surface of the principal portion, and then forming a seal layer.

The seal layer is formed by a hermetic seal using a ceramic package, a metallic can or the like, or by a resin seal using a molding silicone resin composition, a molding epoxy resin composition or the like.

The principal portion of the semiconductor device referred to herein includes an active element portion, e.g. discrete elements and semiconductor IC, a passive portion, e.g. resistors and capacitors, as well as circuits. This is also the case with the principal portion of semiconductor chip.

In the semiconductor device of the present invention, it is sufficient for the heat-bondable cured silicone to be applied and heat-bonded to the surface of the principal portion. In addition to the surface of the principal portion of the semiconductor device, the heat-bondable cured silicone may be applied and heat-bonded to the surface of the peripheral portion adjacent to the principal portion. However, the present invention is characteristic in that when the semiconductor device is a wire bonding type, the heat-bondable cured silicon is not in contact with bonding wires; when the semiconductor device is a flip chip type, the heat-bondable cured silicone is not in contact with solder; and when the semiconductor device is a beam lead type, the heat-bondable cured silicone is not in contact with beam leads. Where the semiconductor device is a hybrid IC and includes other parts and circuits in addition to a semiconductor chip, the heat-bondable cured silicone may be applied and heat-bonded also to such other parts and circuits as well as an insulating substrate. Examples of such other parts include resistors and capacitors.

BEST FORM FOR PRACTISING THE INVENTION

Semiconductor devices according to embodiments of the present invention will be described hereinunder with reference to the accompanying drawings and in comparison with conventional semiconductor devices.

Figure 1:
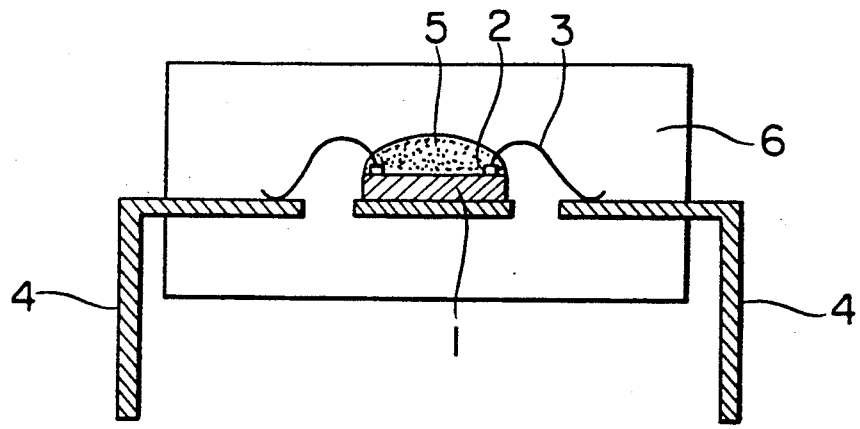
FIG. 1 is a sectional view of a conventional wire bonding, resin sealed type IC.

FIG. 1 is a sectional view of a conventional wire bonding, resin sealed type IC, in which the surface of a semiconductor chip 1, bonding pads 2 and part of 25μ-dia. gold bonding wires 3 are coated with a liquid junction coating silicone resin 5, which is heat-cured after coating, and are sealed together with the remaining portion of the bonding wires 3 and part of lead wires 4 for external connection by molding with a sealing epoxy resin 6. In this conventional IC, there arise such problems as breaking of the bonding wires 3 at 200 cycles when the IC is subjected to a heat cycle test in which one cycle covers −65° C. as the lowest temperature and 180° C. as the highest temperature in 3 hours; breaking of the bonding wires 3 at 20 cycles when the IC is subjected to a heat shock test in which it is held at −50° C. for 30 minutes and immediately thereafter held at 150° C. for 30 minutes; and breaking of the bonding wires 3 due to swelling of the junction coating silicone resin caused by silicone oil which has permeated the resin when the IC is subjected to a heat fatigue test in which turning on and off of power is repeated after applying to the IC a silicone compound for heat dissipation.

An attempt to coat the principal portion of the semiconductor chip 1 with the junction coating silicone resin 5 so as not to contact the resin with the bonding pads 2 and bonding wires 3 for avoiding the occurrence of the above-mentioned problems, encounters an extreme difficulty in the actual operation because the junction coating silicone resin 5 is liquid and the semiconductor chip 1 is very small.

Figure 2:
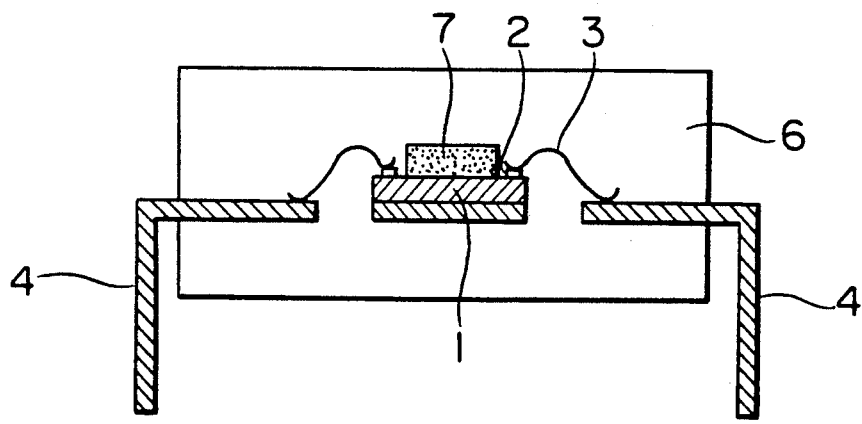
FIG. 2 is a sectional view of a wire bonding, resin sealed type IC according to an embodiment of the present invention.

FIG. 2 is a sectional view of a wire bonding, resin sealed type IC according to an embodiment of the present invention, in which the principal portion of a semiconductor chip 1 is coated with a heat-bondable cured silicone 7 which comprises a heat-bondable silicone rubber film and which is heat-bonded to the principal portion after coating. The heat-bondable silicone rubber film is so disposed as to be in contact with neither bonding wires 3 nor bonding pads 2. Together with the bonding pads 2, bonding wires 3 and part of lead wires 4 for external connection, the thus-coated semiconductor chip 1 is sealed by molding with a sealing epoxy resin 6. This IC is characteristic in that the bonding wires 3 do not break even at 1,000 cycles when the IC is subjected to the heat cycle test, in that the bonding wires 3 do not break even at 600 cycles when the IC is subjected to the heat shock test and in that the bonding wires 3 do not break even when the IC is subjected to the heat fatigue test after applying thereto a silicone compound for heat dissipation.

Figure 3:
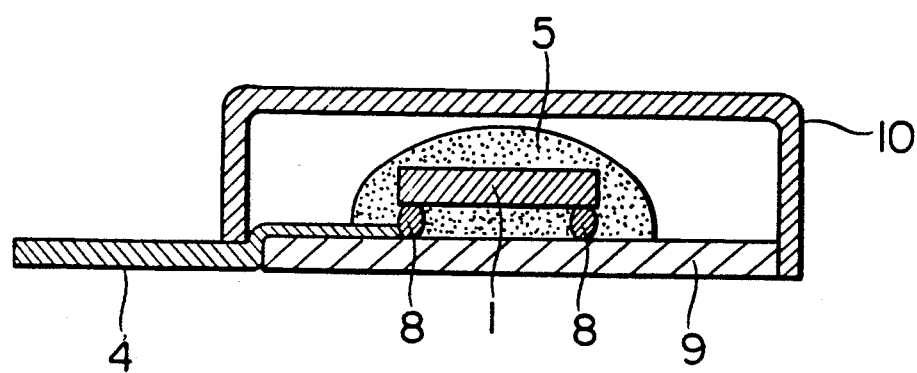
FIG. 3 is a sectional view of a conventional flip chip, hollow package type IC.

FIG. 3 is a sectional view of a conventional flip chip, hollow package type IC, in which a semiconductor chip 1 is fixed to a substrate 9 by soldering as indicated at 8 and is connected through a solder portion 8 to a lead wire 4 for external connection. The whole of the semiconductor chip 1 and of the solder portions 8 as well as part of the lead wire 4 for external connection and of the substrate 9 are coated with a liquid junction coating silicone resin 5, which is heat-cured after coating. Further, a hollow packaging is made using a plastic case 10.

This IC also involves problems such as cracking of the solder portions 8 at 300 cycles when the IC is subjected to the heat cycle test, cracking of the solder portions 8 at 50 cycles when the IC is subjected to the heat shock test, and cracking of the solder portions 8 due to swelling of the junction coating silicone resin 5 caused by silicone oil which has permeated the resin when the IC is subjected to the heat fatigue test after applying thereto a silicone compound for heat dissipation. In producing this type of IC, even an attempt to fix the semiconductor chip 1 to the substrate 9 by the solder portions 8 after applying and heat-curing the liquid junction coating silicone resin 5 to the principal portion of the chip 1 would result in a poor bonding of the solder portions 8 because the portion surrounding the principal portion of the chip 1 is contaminated by a silicone exhalation at the time of curing of the junction coating silicone resin. Thus, it is virtually impossible to produce this type of IC.

Figure 4:
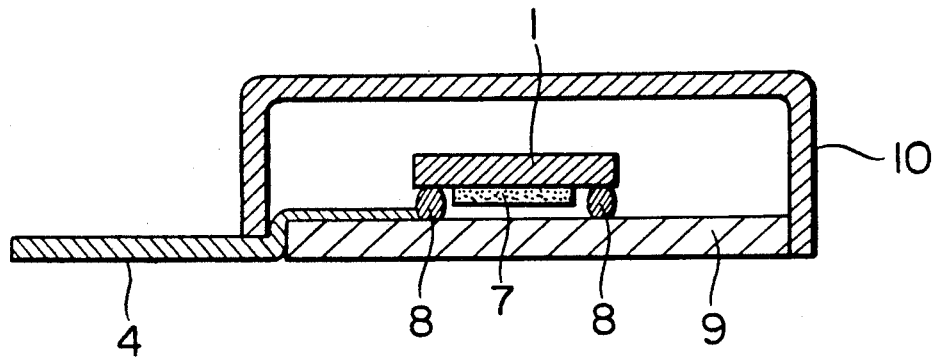
FIG. 4 is a sectional view of a flip chip, hollow package type IC according to another embodiment of the present invention.

FIG. 4 is a sectional view of a flip chip, hollow package type IC according to another embodiment of the present invention, in which a semiconductor chip 1 is fixed to a substrate 9 by soldering as indicated at 8 and is connected through a solder portion 8 to a lead wire 4 for external connection. The principal portion of the semiconductor chip 1 is coated with a heat-bondable cured silicone 7 which comprises a heat-bondable silicone rubber film and which is heat-bonded to the principal portion after coating. Further, a hollow packaging is made using a plastic case 10. In this IC, the heat-bondable silicone rubber film is not in contact with the solder portions 8 and a gap is formed between the film and the substrate 9, so the solder portions 8 do not crack even at 1,000 cycles when the IC is subjected to the heat cycle test, even at 800 cycles when the IC is subjected to the heat shock test, and even when the IC is subjected to the heat fatigue test after applying thereto a silicone compound for heat dissipation.

Figure 5:
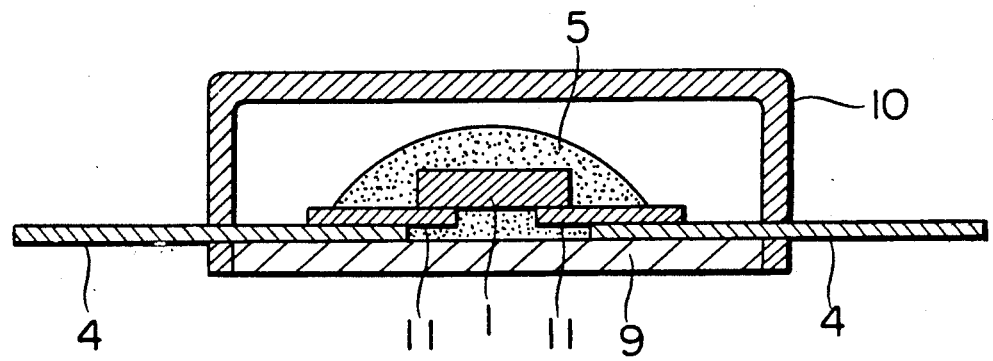
FIG. 5 is a sectional view of a conventional beam lead, hollow package type IC.

FIG. 5 is a sectional view of a conventional beam lead, hollow package type IC, in which a semiconductor chip 1 is fixedly connected through beam leads 11 to lead wires 4 for external connection, and a liquid junction coating silicone resin 5 is applied and heat-cured to the whole of the semiconductor chip 1, the greater part of the beam leads 11 and the space between the chip 1 and the substrate 9. Further, a hollow packaging is made using a plastic case 10.

This IC also involves problems, for example, the bonding between the semiconductor chip 1 and the beam leads 11 or between the beam leads 11 and the external connection lead wires 4 is broken at 400 cycles when the IC is subjected to the heat cycle test, and also at 100 cycles when the IC is subjected to the heat shock test.

Even if an attempt is made to fixedly connect the semiconductor chip 1 to the external connection lead wires 4 through the beam leads 11 after applying and heat-curing the liquid junction coating silicone resin to the principal portion of the chip 1, the portion surrounding the principal portion of the chip 1 may also be coated, or even if it is not coated, it will be contaminated by a silicone exhalation at the time of curing of the junction coating silicone resin with the result that the bonding of the beam leads 11 to the semiconductor chip 1 becomes poor. Thus, it is virtually impossible to produce this type of IC.

Figure 6:
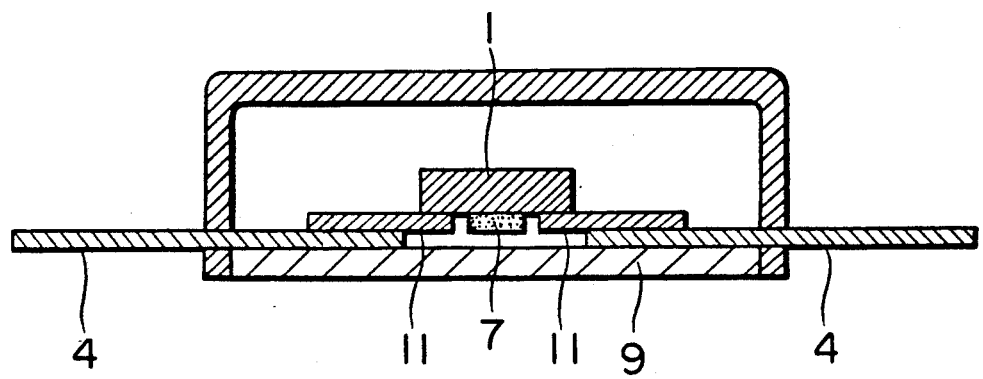
FIG. 6 is a sectional view of a beam lead, hollow package type IC according to still another embodiment of the present invention.

FIG. 6 is a sectional view of a beam lead, hollow package type IC according to still another embodiment of the present invention, in which the principal portion of a semiconductor chip 1 is coated with a heat-bondable cured silicone 7 which comprises a heat-bondable silicone resin film and which is heat-bonded to the principal portion of the chip after coating. The semiconductor chip 1 is fixedly connected through beam leads 11 to lead wires 4 for external connection so that the beam leads 11 and a substrate 9 are not in contact with the heat-bondable silicone resin film 7. Further, a hollow packaging is made using a plastic case 10.

Since the heat-bondable silicone resin film 7 is not in contact with the beam lead 11 and there is a gap between the film 7 and the substrate 9, the bonding between the semiconductor chip 1 and the beam leads 11 and that between the beam leads 11 and the external connection lead wires 4 are broken neither at 1,000 cycles when the IC is subjected to the heat cycle test not at 500 cycles when the IC is subjected to the heat shock test.

The heat-bondable silicone film as the heat-bondable cured silicone rubber 7 used in the semiconductor devices of FIGS. 2 and 4 had been prepared by pouring onto a Teflon film a composition comprising a methylphenylsiloxane-dimethylsiloxane copolymer (viscosity at 25° C.: 2,000 CP) having both ends blocked with dimethylvinylsilyl groups, methylhydrogen polysiloxane (viscosity at 25° C.: 20 CP) having both ends blocked with trimethylsilyl groups and a platinum-vinylsiloxane complex catalyst, at an SiH/SiCH=CH$_2$ equivalent ratio of 4/1, then curing the composition by heating at 100° C. for 5 minutes and peeling the resultant film (hardness 2) having a thickness of 250μ from the Teflon film. The side not contacted with the Teflon film was used for bonding to the semiconductor chip. The heat bonding was performed at 150° C. for 1 hour.

The heat-bondable silicone resin film as the heat-bondable cured silicone 7 used in the semiconductor device of FIG. 6 had been prepared by pouring onto a polypropylene film a composition comprising a dimethylvinylsiloxane-dimethylsiloxane-siloxane copolymer (viscosity at 25° C.: 4,000 CP), methylhydrogen polysiloxane (viscosity at 25° C.: 20 CP) having both ends blocked with trimethylsilyl groups and a platinum-vinylsiloxane complex catalyst, at an SiH/SiCH=CH$_2$ equivalent ratio of 5/1, then curing the composition by heating at 100° C. for 5 minutes and peeling the resultant film (hardness 90) having a thickness of 120μ from the polypropylene film. The side not contacted with the polypropylene film was used for bonding to the semiconductor chip. The heat bonding was performed at 170° C. for 30 minutes.

Next, the above heat-bondable silicone rubber film was applied and heat-bonded to the surface of a semiconductor chip in a transistor without contacting 30μ-dia. aluminum bonding wires and then the surroundings were sealed by molding with a sealing silicone resin. The wire bonding type transistor thus sealed with the silicone resin was subjected to a heat fatigue test involving repetition of turning on and off of power after applying thereto a silicone compound for heat dissipation. As a result, the aluminum bonding wires did not break even at 20,000 cycles.

Figure 7:
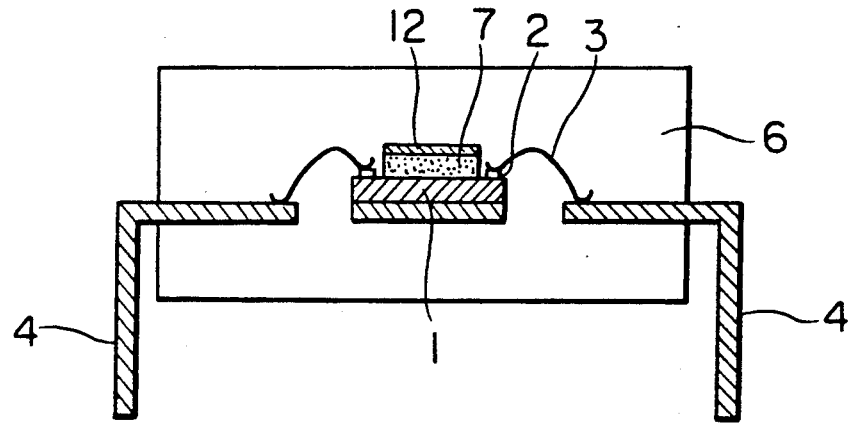
FIG. 7 is a sectional view of a wire bonding, resin sealed type IC according to a further embodiment of the present invention.

FIG. 7 is a sectional view of a wire bonding, resin sealed type IC according to a further embodiment of the present invention, in which the principal portion of a semiconductor chip 1 is coated with a heat-bondable cured silicone 7 which comprises a heat-bondable silicone rubber film with a polyimide film 12 laminated thereto and which is heat-bonded to the principal portion of the chip after coating. The heat-bondable silicone rubber film is so disposed as to contact neither bonding wires 3 nor bonding pads 2. Together with the bonding pads 2, bonding wires 3 and part of lead wires 4 for external connection, the thus-coated semiconductor chip 1 is sealed by molding with a sealing epoxy resin 6. This IC is characteristic in that the bonding wires 3 do not break even at 1,000 cycles when the IC is subjected to the heat cycle test, even at 600 cycles when the IC is subjected to the heat shock test, and even when the IC is subjected to the heat fatigue test after applying thereto a silicone compound for heat dissipation.

Figure 8:
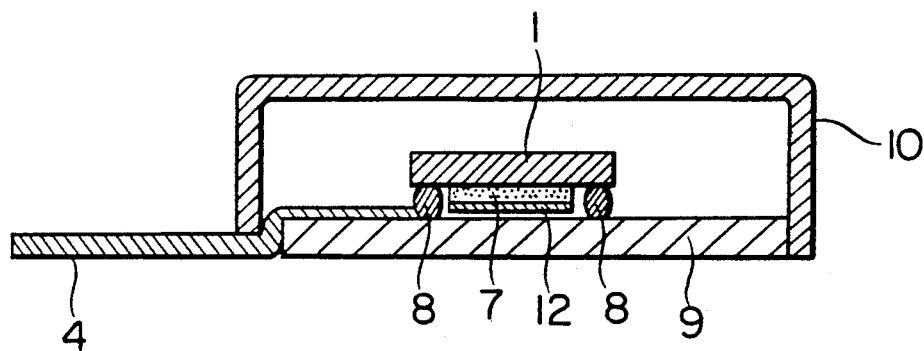
FIG. 8 is a sectional view of a flip chip, hollow package type IC according to still a further embodiment of the present invention.

FIG. 8 is a sectional view of a flip chip, hollow package type IC according to still a further embodiment of the present invention, in which a semiconductor chip 1 is fixed to a substrate by soldering as indicated at 8 and is connected through a solder portion 8 to a lead wire 4 for external connection. The principal portion of the semiconductor chip 1 is coated with a heat-bondable cured silicone which comprises a heat-bondable silicone rubber film with a polyimide film 12 laminated thereto and which is heat-bonded to the principal portion of the chip after coating. Further, a hollow packaging is made using a plastic case 10. In this IC, since the heat-bondable silicone rubber film is not in contact with the solder portions 8 and there is a gap between the film and the substrate 9, the solder portions 8 do not crack even at 1,000 cycles when the IC is subjected to the heat cycle test, even at 800 cycles when the IC is subjected to the heat shock test, and even when the IC is subjected to the heat fatigue test after applying thereto a silicone compound for heat dissipation.

Figure 9:
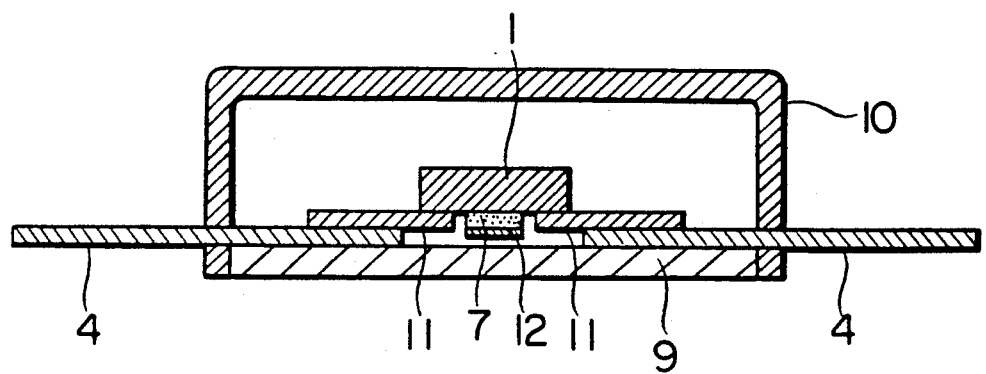
FIG. 9 is a sectional view of a conventional beam lead, hollow package type IC according to still another embodiment of the present invention.

FIG. 9 is a sectional view of a beam lead, hollow package type IC according to still another embodiment of the present invention, in which the principal portion of a semiconductor chip 1 is coated with a heat-bondable cured silicone 7 which comprises a heat-bondable silicone resin film with a polyimide film 12 laminated thereto and which is heat-bonded to the principal portion of the chip after coating. The semiconductor chip 1 is fixedly connected through beam leads 11 to lead wires 4 for external connection so that the beam leads 11 and the substrate 9 do not contact the heat-bondable silicone resin film 7. Further, a hollow packaging is made using a plastic case 10.

Since the heat-bondable silicone resin film 7 is not in contact with the beam leads 11 and there is a gap between the film and the substrate 9, the bonding between the semiconductor chip 1 and the beam leads 11 and that between the beam leads 11 and the external connection lead wires 4 are broken neither at 1,000 cycles when the IC is subjected to the heat cycle test, nor at 500 cycles when the IC is subjected to the heat shock test.

The heat-bondable silicone film as the heat-bondable cured silicone rubber 7 with the polyimide film 12 laminated thereto used in the semiconductor devices of FIGS. 7 and 8 had been prepared by pouring a composition into a 250μ high mold located on a 25μ thick polyimide film, the composition comprising a methylphenylsiloxane-dimethylsiloxane copolymer (viscosity at 25° C.: 2,000 CP) having both ends blocked with dimethylvinylsilyl groups, methyl-hydrogen polysiloxane (viscosity at 25° C.: 20 CP) having both ends blocked with trimethylsilyl groups and a platinum-vinylsiloxane complex catalyst at an SiH/SiCH=CH$_2$ equivalent ratio of 4/1, then covering the composition with a 50μ thick polypropylene film, followed by heat curing at 100° C. for 5 minutes, and then peeling the resultant polyimide film-laminated 250μ thick film (hardness 2) from the polypropylene film. The side contacted with the polypropylene film was used for bonding to the semiconductor chip. The heat bonding was performed at 150° C. for 1 hour.

The heat-bondable silicone resin film as the heat-bondable cured silicone 7 with the polyimide film 12 laminated thereto used in the semiconductor device of FIG. 7 had been prepared by pouring a composition into a 120μ high mold located on a 10μ thick polyimide film, the composition comprising a dimethyl-vinylsiloxane-dimethylsiloxane-siloxane copolymer (viscosity at 25° C.: 4,000 CP), methylhydrogen polysiloxane (viscosity at 25° C.: 20 CP) having both ends blocked with trimethylsilyl groups, vinyltriethoxysilane and a platinum-vinylsiloxane complex catalyst at an SiH/-SiCH=CH$_2$ equivalent ratio of 5/1, then covering the composition with a 50μ thick polypropylene film, followed by heat curing at 100° C. for 3 minutes, and peeling the resultant polyimide film-laminated 120μ thick film from the polypropylene film. The side contacted with the polypropylene film was used for bonding to the semiconductor chip. The heat bonding was performed at 170° C. for 30 minutes.

Next, the heat-bondable silicone rubber film shown in FIG. 2 and the heat-bondable silicone rubber film with the polyimide film 12 laminated thereto shown in FIG. 7 were each applied and heat-bonded to the surface of a semiconductor chip without contacting 30μ-dia. aluminum bonding wires and then the surroundings were sealed by molding with a sealing silicone resin. The wire bonding type transistors thus sealed with the silicone resin were each subjected, after applying thereto a silicone compound for heat dissipation, to a fatigue test involving turning on and off of power. As a result, in both transistors, the aluminum bonding wires did not break even at 20,000 cycles.

INDUSTRIAL UTILIZABILITY

As set forth hereinabove, the semiconductor device of the present invention has the following features.

1. A high reliability is attained because the heat-bondable cured silicone is applied and heat-bonded to the principal portion of the semiconductor device.

2. Breaking of bonding wire, cracking of solder and separation of beam lead do not occur because only the portion to be protected can be exactly protected by coating and the portion not to be coated is not coated.

3. Because a cured silicone is used, bonding pads, the substrate surface and lead wires for external connection are not contaminated by silicone, thereby preventing the occurrence of a defective bonding and affording a superior adhesion of a sealing resin.

What is claimed is:

1. A process for forming a semiconductor device having a protective coating which comprises applying a heat-bondable, previously cured silicone to at least a major portion of the surface of the semiconductor device and heat-bonding the silicone to said surface.

2. The process device as set forth in claim 1, which is a wire bonding type semiconductor device with said heat-bondable cured silicone applied and heat-bonded to the surface of at least a principal portion thereof without contacting bonding wires.

3. The semiconductor device as set forth in claim 1, which is a flip chip type semiconductor device with said heat-bonded cured silicone applied and heat-bonded to the surface of at least a principal portion thereof without contacting solder.

4. The process device as set forth in claim 1, which is a beam lead type semiconductor device with said heat-bondable cured silicone applied and heat-bonded to the surface of at least a principal portion thereof without contacting beam leads.

5. The process device as set forth in any one of claims 2, 3 and 4, wherein said principal portion of the semiconductor device is a principal portion of a semiconductor chip.

6. The process device as set forth in claim 1, wherein said heat-bondable cured silicone is a heat-bondable silicone rubber film.

7. The process device as set forth in claim 6, wherein the thickness of said heat-bondable silicone rubber film is in the range of 30 microns to 1 millimeter.

8. The process device as set forth in claim 1, wherein said heat-bondable cured silicone is a heat-bondable silicone resin film.

9. The process device as set forth in claim 8, wherein the thickness of said heat-bondable silicone resin film is in the range of 30 microns to 1 millimeter.

10. The process device as set forth in claim 1, wherein a heat-resistant base material is laminated to one side of said heat-bondable cured silicone.

11. The process device as set forth in claim 10, wherein the thickness of said heat-resistant base material is in the range of 1 to 100 microns.

12. The process device as set forth in claim 10, wherein said heat-resistant base material is a heat-resistant plastic film.

13. The process device as set forth in claim 12, wherein said heat-resistant plastic film is a polyimide film.

14. The process device as set forth in claim 1, wherein said heat-bondable cured silicone is a cured silicone having silicon atom-bonded hydrogen atoms in a cured state.

15. The process device as set forth in claim 14, wherein said cured silicone is a cured product of a composition which contains as main components a vinyl group-containing organopolysiloxane, an organohydrogen polysiloxane and a platinum compound catalyst and in which silicon atom-bonded hydrogen atoms are present in a large excess relative to silicon atom-bonded vinyl groups.

* * * * *

UNITED STATES PATENT AND TRADEMARK OFFICE
CERTIFICATE OF CORRECTION

PATENT NO. : 5,008,733

DATED : April 16, 1991

INVENTOR(S) : Katsutoshi Mine, et al.

It is certified that error appears in the above-identified patent and that said Letters Patent is hereby corrected as shown below:

In the Abstract, line 16: "sisnce" should read as --since--

Column 10, line 3, Claim 2: delete "device"

Column 10, line 7, Claim 3: delete "semiconductor" and insert --process--

Column 10, lines 13, 18, 23, 26, 29, 32, 35, 38, 41, 44, 47 and 51, Claims 4-15: delete "device"

Signed and Sealed this

Twenty-ninth Day of September, 1992

Attest:

DOUGLAS B. COMER

*Attesting Officer*        *Acting Commissioner of Patents and Trademarks*